United States Patent
Kalkreuter et al.

(10) Patent No.: US 9,509,108 B2
(45) Date of Patent: Nov. 29, 2016

(54) BUS CONNECTOR SYSTEM FOR ELECTRICAL EQUIPMENT

(71) Applicant: Bender GmbH & Co. KG, Gruenberg (DE)

(72) Inventors: Ulrich Kalkreuter, Homberg Ohm (DE); Helmut Mess, Kirtorf (DE); Gerhard Mueller, Gruenberg (DE)

(73) Assignee: BENDER GMBH & CO. KG, Grünberg (DE)

( * ) Notice: Subject to any disclaimer, the term of this patent is extended or adjusted under 35 U.S.C. 154(b) by 0 days.

(21) Appl. No.: 14/790,135

(22) Filed: Jul. 2, 2015

(65) Prior Publication Data

US 2016/0006199 A1    Jan. 7, 2016

(30) Foreign Application Priority Data

Jul. 3, 2014  (DE) .................... 10 2014 212 969

(51) Int. Cl.
  *H01R 25/00* (2006.01)
  *H01R 25/16* (2006.01)
  *H05K 7/14* (2006.01)

(52) U.S. Cl.
  CPC .......... *H01R 25/162* (2013.01); *H05K 7/1478* (2013.01)

(58) Field of Classification Search
  CPC ............. H01R 25/162; H05K 7/1478; H05K 7/1457; H05K 7/1484; H06K 7/0004; G06F 1/185; G06F 3/0202
  USPC ........................................................ 439/121
  See application file for complete search history.

(56) References Cited

U.S. PATENT DOCUMENTS

| | | | |
|---|---|---|---|
| 4,790,762 A | 12/1988 | Harms et al. | |
| 5,532,907 A * | 7/1996 | Asselta | H05K 7/1457 361/648 |
| 6,542,355 B1 * | 4/2003 | Huang | G06F 3/0202 312/223.2 |
| 7,286,899 B2 * | 10/2007 | Dachs | H05K 7/1484 156/125 |
| 9,229,504 B1 * | 1/2016 | Marr | G06F 1/26 |
| 2004/0257919 A1 * | 12/2004 | Hsieh | G06K 7/0004 369/1 |
| 2005/0100282 A1 * | 5/2005 | Okada | G02B 6/2808 385/46 |
| 2006/0056154 A1 * | 3/2006 | Foster | G06F 1/185 361/700 |

FOREIGN PATENT DOCUMENTS

| | | |
|---|---|---|
| DE | 29609635 U1 | 8/1996 |
| DE | 29805305 U1 | 7/1999 |
| DE | 10116957 A1 | 10/2002 |
| DE | 20120478 U1 | 4/2003 |
| DE | 202006006615 U1 | 9/2006 |
| DE | 102006031129 A1 | 1/2007 |
| DE | 102010044065 A1 | 5/2012 |
| DE | 102012213258 A1 | 1/2014 |
| JP | H1195807 A | 4/1999 |

* cited by examiner

*Primary Examiner* — Jean F Duverne
(74) *Attorney, Agent, or Firm* — King & Schickli, PLLC

(57) ABSTRACT

The invention relates to a bus connector system having a bus circuit board for producing an electrical connection between electrical equipment, the bus circuit board being attached in a removable manner to a housing of the electrical equipment.

Figure 1A:
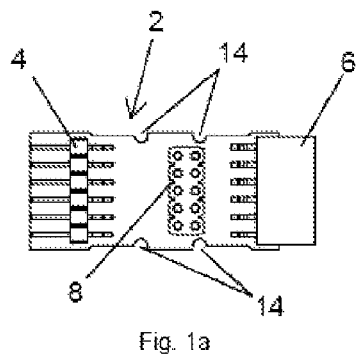

The underlying idea of the present invention is advantageously based on the bus circuit board being connected directly to the housing of the electrical equipment. Thus, no support rail is necessary for producing the electrical contact between the equipment.

8 Claims, 4 Drawing Sheets

BUS CONNECTOR SYSTEM FOR ELECTRICAL EQUIPMENT

This application claims the benefit of German patent application Ser. No. 10 2014 212 969.9, the disclosure of which is incorporated herein by reference.

TECHNICAL FIELD

The invention relates to a bus connector system comprising a bus circuit board for producing an electrical connection between electrical equipment.

BACKGROUND OF THE INVENTION

In view of automation and in particular monitoring of electrical installations, the integration of electrical equipment is becoming increasingly important. One of the main tasks is ensuring a reliable exchange of information between monitoring and measuring devices that are able to communicate and whose structure is increasingly modular. Aside from the specification and application of transmission protocols, the physical design of data transmission, too, plays an important role for an error-free communication between the devices and systems. In particular the quick and cost-effective production of an electrical and mechanical connection between devices, which is required in case of an extended function of the electrical installation, is often difficult.

From the state of the art, the 16-pin DIN rail bus connector system HBUS by Phoenix Contact (www.phoenix-contact.com) is known, for example. The bus connector system HBUS is based on a DIN-rail bus connector having a corresponding housing width, which is inserted into a mounting rail (C-section DIN rail) and locked to it. The DIN rail bus connectors are electrically contacted via 16-pin male and female connector strips by being laterally pushed together. The device housings can be snapped onto the C-section DIN rail and thus simultaneously onto the DIN rail bus connectors. The electrical contact with the device electronics is produced by way of an 18-pin male connector strip that is located on a circuit board in the respective device housing and by way of an 18-pin female connector strip on the DIN rail bus connector.

An electronics housing that is configured for a bus connector system of this kind and comprises a housing base portion that can be locked onto a mounting rail and bus connectors that can be plugged together and be locked onto the mounting rail in a slidable manner is disclosed in document DE 20 2006 006 615 U1.

Furthermore, a bus system by E. Dold & Söhne K G is known from the state of the art under the name "In-Rail-Bus—Bussystem in der Hutschiene" (in-rail bus—bus system in a top hat rail). In said system, a support profile made of plastic and having a pre-installed bus circuit board is placed into a C-section DIN rail. Parallel circuit paths are printed onto the bus circuit board, which are contacted via spring contact blocks that are installed on the circuit boards of the devices when the device housings snap onto the mounting rail.

A similar arrangement is described in document DE 10 2006 031 129 A1. The device system disclosed there has device modules that are mounted on a support rail and are connected to one another via a bus line arranged in the support rail. The bus line has the shape of an elongated circuit board and is fixed within the support rail by means of snap-on support elements.

All of the afore-mentioned bus connector systems are based on the fact that they function only if they are mounted in a C-section DIN rail (top hat rail as mounting rail/support rail). First, the bus circuit board or the bus connector has to be positioned in the support rail with the aid of suitable holding means before the electrical device can be attached to the mounting rail by means of additional fastening means. The obligatory use of a mounting rail can prove disadvantageous in terms of mounting effort.

Thus, the object of the present invention is to design a bus connector system for electrical equipment that realizes both flexible electrical contacting and an extendable mechanical connection in a simple and cost-effective manner.

SUMMARY OF THE INVENTION

The object is attained in conjunction with the preamble of claim 1 in that the bus circuit board is attached in a removable manner to a housing of the electrical equipment.

The underlying idea of the present invention is advantageously based on the bus circuit board being connected directly to the housing of the electrical equipment. A support rail is not necessary for producing the electrical contact between the equipment. The direct attachment according to the invention of the bus circuit board to an outer side of the equipment housing without the use of a support rail thus allows employing inexpensive circuit boards in the function of a bus circuit board.

The bus circuit board is dimensioned in such a manner that it can be attached to a C-section DIN rail while being connected to the equipment housing. At the same time, the bus circuit board can be designed as desired within the space made available by the C-section DIN rail. For instance, the arrangement and the number of electrical contacts of the bus circuit board can be individually tailored to the electrical equipment.

Since the production of the electrical connection between the electrical equipment is not tied to the use of a support rail, it is possible to install the housing with the attached bus circuit board to any kind of mounting plate instead of a C-section DIN rail.

The bus circuit boards preferably have a rectangular base whose dimensions can be adjusted to DIN installation housings with a 45 mm standard cutout but are basically freely selectable. By plugging the bus circuit boards together, an elongated arrangement of buses is produced in the shape of a mechanical cross-connection for the housings of the electrical equipment, which are arranged side by side.

In another advantageous embodiment, the bus circuit board is attached to a housing wall of the housing using a snap element. The snap connection being a force-locking and form-fitting connection (clip system) reduces the mounting effort compared to other connecting techniques, such as screw connections, and can be easily released in contrast to welding or gluing methods. The bus circuit board can be attached to any housing wall of the housing as long as the properties of the housing wall are suitable for said attachment.

Advantageously, the snap element is realized as an integrated component on the housing wall. Thus, the snap element is a fixed component of the housing wall. In view of a cost-efficient and easily mounted solution, the integrated design reduces the number of individual parts of the bus connector system. The bus circuit board is simply clipped into the snap elements on the housing wall. The snap elements are preferably realized as snap hooks. The snap hook being a bending element with a high deformation resistance ensures a reliable mechanical connection when locking with the bus circuit board.

Alternatively to the afore-mentioned snap connection (clip system), the bus circuit board is attached to a housing wall of the housing using a holding bracket that is realized as a separate component. In contrast to the integrated design of the snap element, the holding bracket is an additional individual part, but because of that it can be optimally tailored to the individual function of fixing the bus circuit board. The holding bracket has one ore multiple crosspieces that run across the bus circuit board.

In a preferred embodiment, the holding bracket has hooks that engage into openings of the housing wall and are secured against release by being laterally displaced and locked in place. To fasten the holding bracket to the housing wall, the holding bracket is provided with hooks at both sides of the bridge-shaped crosspiece(s), said hooks being plugged into slot-shaped openings of the housing, where they are locked.

Furthermore, the bus circuit board has an outer contour having recesses that are engaged by the snap element or by the holding bracket. At the edges oriented toward the longitudinal extension of the bus, the (outer) contour of the bus circuit board is shaped by recesses or protrusions in such a manner that the snap elements or the holding bracket are secured against lateral sliding on the bus circuit board, the housing wall thus being fixed relative to the bus circuit board.

In an advantageous embodiment, the bus circuit board has a male connector strip and a female connector strip by means of which an electrical contact and a pluggable mechanical connection can be produced between the bus circuit boards. The edges of the bus circuit board running perpendicularly to the longitudinal extension of the bus are provided with a male connector strip and on the opposite side correspondingly with a female connector strip so that a mechanical cross-connection for housings arranged side by side is produced by plugging together the male and female connector strips of multiple bus circuit boards. The male and female connector strips are designed with multiple pins, the number of contacts being variable and adaptable to the given requirements.

Advantageously, the bus circuit board has spring contacts for electrically contacting terminal contacts of the electrical equipment. The electrical equipment can be placed into or onto the housing that is connected to the bus circuit board so that the equipment is electrically contacted via spring contacts that are arranged on the bus circuit board.

BRIEF DESCRIPTION OF THE DRAWING FIGURES

Other advantageous design features become apparent from the following description and from the drawings, which show a preferred embodiment of the invention with the aid of examples.

Figure 1B:
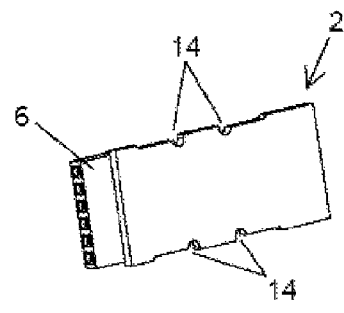
Figure 2A:
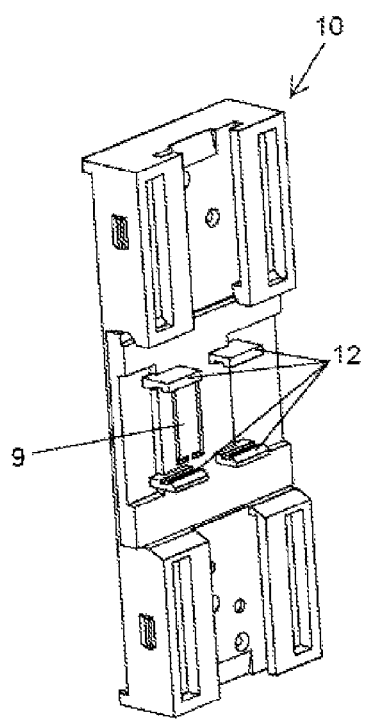
Figure 2B:
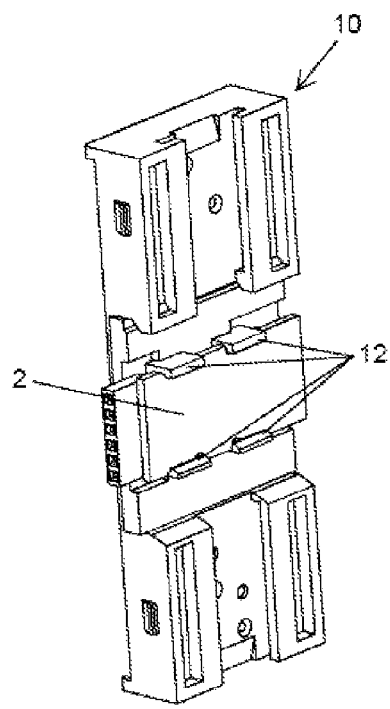
Figure 3A:
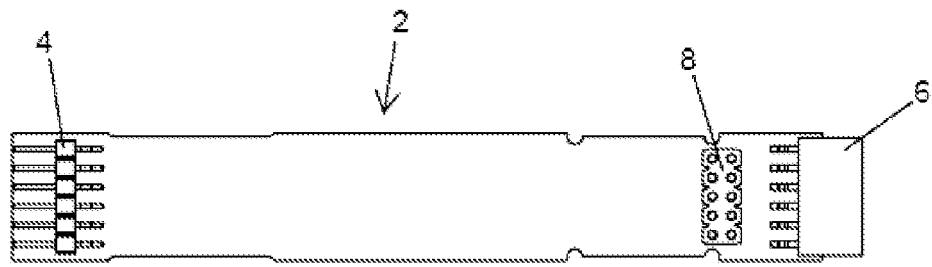
Figure 3B:
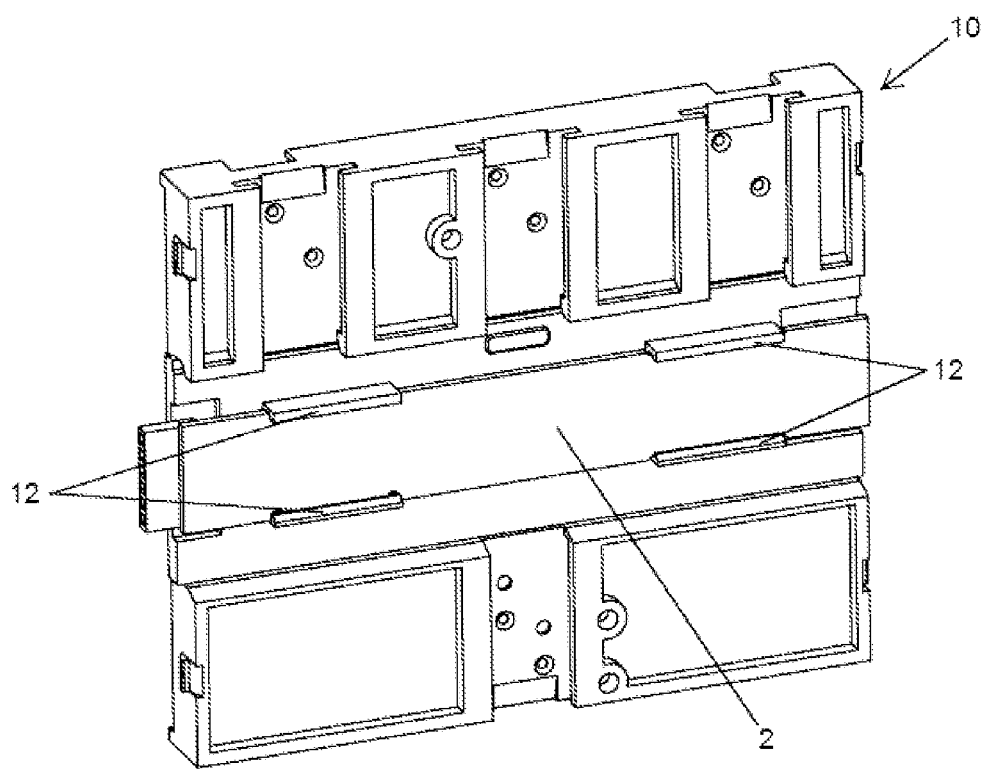
Figure 4:
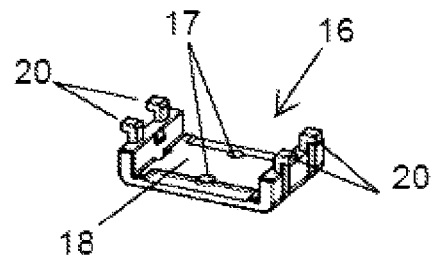
Figure 5A:
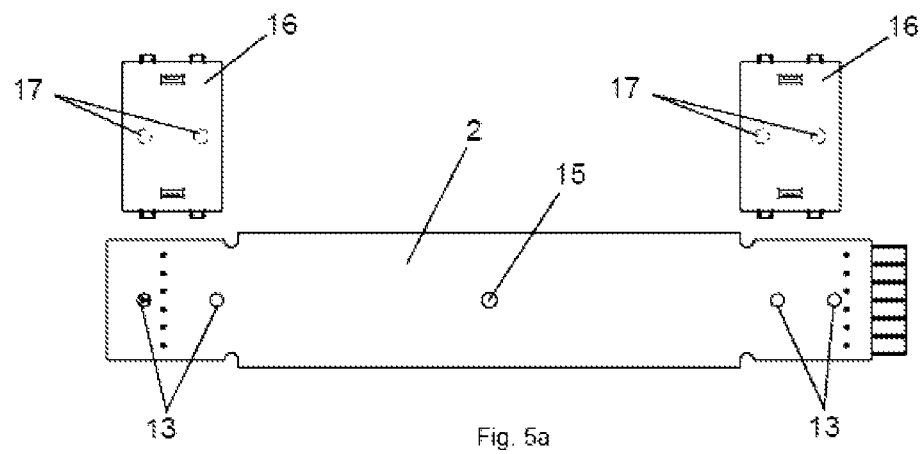
Figure 5B:
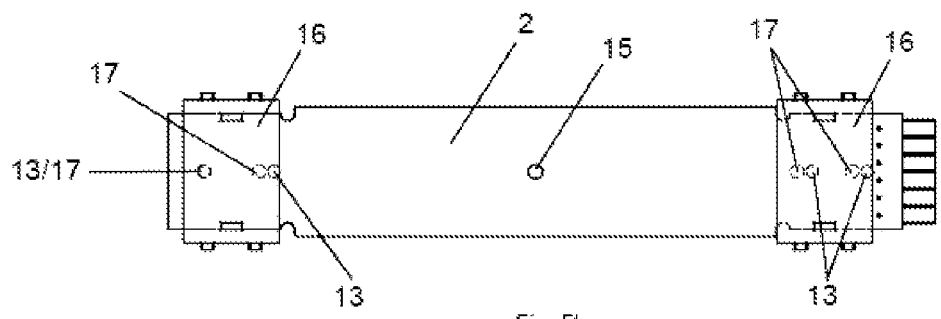
Figure 6A:
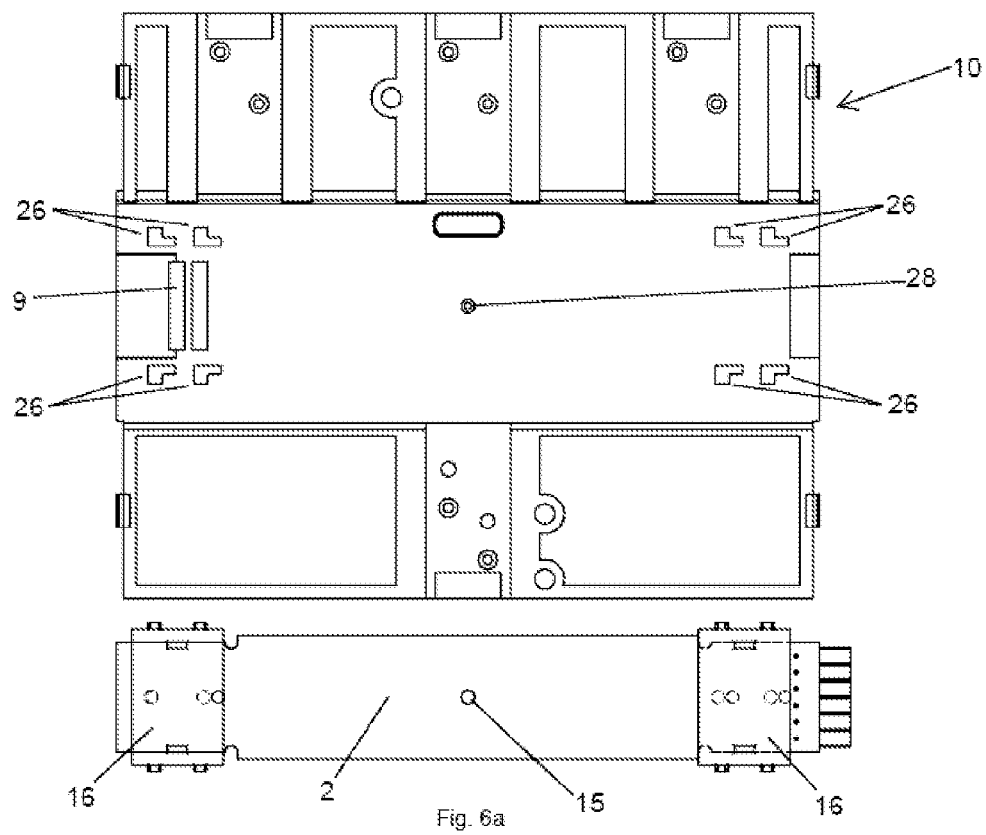
Figure 6B:
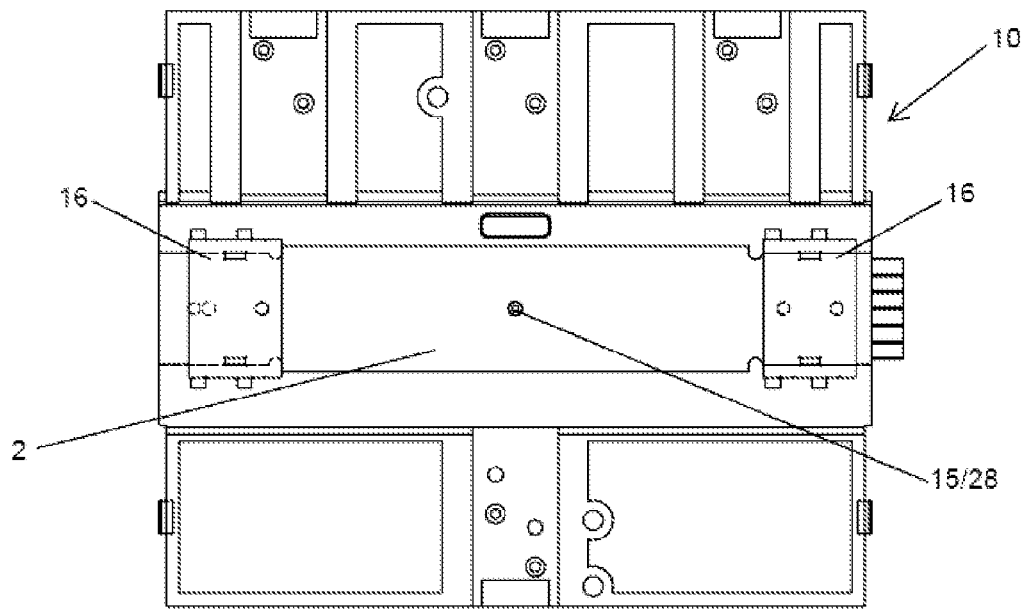

In the figures:

FIG. 1a: shows a contact side of a bus circuit board (2 HP) with a male connector strip, a female connector strip and spring contacts, FIG. 1b: shows a rear side of the bus circuit board (2 HP) with visible female connector strip, FIG. 2a: shows a housing wall (2 HP) with integrated snap elements, FIG. 2b: shows the housing wall (2 HP) with a snapped-on bus circuit board, FIG. 3a: shows the contact side of a bus circuit board (6 HP) with a male connector strip, a female connector strip and spring contacts, FIG. 3b: shows the housing wall (6 HP) with a snapped-on bus circuit board, FIG. 4: shows a holding bracket, FIG. 5a: shows the bus circuit board with two unmounted holding brackets, FIG. 5b: shows the bus circuit board with two mounted holding brackets, FIG. 6a: shows the housing wall of a mounting housing with the unmounted bus circuit board of FIG. 5b, and FIG. 6b: shows the housing wall of the mounting housing with the mounted bus circuit board of FIG. 5b.

DETAILED DESCRIPTION

FIG. 1a shows a bus circuit board 2 for attachment to a housing wall 10 (FIG. 2a) of a 36 mm (2 horizontal pitches/HP) wide DIN installation housing having a 45 mm standard cutout. A contact side of the bus circuit board 2 having a male connector strip 4, a female connector strip 6 and spring contacts 8 is illustrated. An electrical and mechanical connection is produced by plugging together the male connector strips 4 and the female connector strips 6 of multiple bus circuit boards 2.

In the view shown in FIG. 1b of a rear side of the bus circuit board 2 opposite of the contact side, the part of the female connector strip 6 that protrudes beyond the bus circuit board 2 is visible. When plugging together multiple bus circuit boards 2, said part receives the male contacts of the male connector strip 4 of the adjacent bus circuit board 2, making it possible to produce a continuous bus connection.

FIG. 2a shows the housing wall 10 of the 2 HP wide DIN installation housing having four integrated snap elements 12, which are realized as snap hooks 12 and are molded to the housing wall 10 in an irremovable fashion. For contacting, the housing wall has a housing opening 9 that corresponds to the spring contacts 8.

As FIG. 2b shows, two of the snap hooks 12 engage behind each of the two longitudinal edges of the bus circuit board 2 when the bus circuit board 2 is snapped on. The snap hooks 12 are secured against lateral sliding relative to the bus circuit board 2 by recesses 14 (FIG. 1a, 1b) in the contour of the edges of the bus circuit board 2 running in the longitudinal extension of the bus.

Analogously to FIG. 1, FIG. 3a shows the contact side having a male connector strip 4, a female connector strip 6 and spring contacts 8 of a bus circuit board 2 for attachment to a housing wall 10 (FIG. 3b) of a 107.5 mm (6 HP) wide DIN installation housing.

The bus circuit board 2 that is snapped onto the 6 HP housing wall 10 is illustrated in FIG. 3b analogously to FIG. 2b.

FIG. 4 shows a holding bracket 16 for attaching the bus circuit board 2 to the housing wall 10 of a mounting housing (FIG. 6a). The holding bracket 16 is designed to have a U-shape and is substantially composed of a crosspiece 18, which forms the middle portion, and two shorter limb portions. Two hooks 20 are molded to each of the limb portions, said hooks 20 being inserted into corresponding openings 26 (FIG. 6a) of the housing wall 10 (FIG. 6a) and being locked in place. The holding bracket 16 has two circular projections 17 that engage into corresponding locking bores 13 of the bus circuit board 2 (FIG. 5a) and serve to lock the holding bracket 16 in place.

In FIG. 5a, the bus circuit board 2 is illustrated together with two holding brackets 16 in the unmounted state. The holding brackets 16 are delineated in a position above the final mounting position prior to being mounted. The recesses or protrusions in the contour of the longitudinal edges of the bus circuit board 2—visible in FIG. 5a below the position in which the not yet mounted holding brackets 16 are illustrated—prevent the holding brackets 16 from laterally sliding along the bus circuit board 2. For exact positioning of the bus circuit board 2 with respect to the housing wall 10, the bus circuit board 2 has a centering bore 15 that receives a centering pin 28 (FIG. 6a, 6b) that is molded to the housing wall 10.

FIG. 5b shows the bus circuit board 2 with mounted holding brackets 16.

In FIG. 6a, the housing wall 10 of a mounting housing according to DIN EN 60715 is shown with the unmounted bus circuit board 2 of FIG. 5b. The housing wall 10 has angular openings 26 into which the hooks 20 (FIG. 4) of the holding brackets 16 can be inserted and locked in place, thus being secured against unintended release.

FIG. 6b shows the housing wall 10 of the mounting housing with the bus circuit board 2 of FIG. 5b being attached to the housing wall 10 by means of the holding brackets 16. The centering pin 28 of the housing wall 10, which engages into the centering bore 15 of the bus circuit board 2, causes the spring contacts 8 to be accurately inserted into the housing opening 9. In addition to the recesses or protrusions in the contour of the longitudinal edges of the bus circuit board 2, the centering pin 28, too, prevents lateral sliding of the bus circuit board 2.

The invention claimed is:

1. A bus connector system comprising a bus circuit board (2) for producing an electrical connection between electrical equipment, wherein
the bus circuit board (2) is attached in a removable manner to a housing of the electrical equipment and that by plugging the bus circuit boards (2) together, an elongated arrangement of buses is produced in the shape of a mechanical cross-connection for the housings of the electrical equipment, which are arranged side by side,
characterized in that
the bus circuit board (2) has spring contacts (8) for electrically contacting terminal contacts of the electrical equipment, said spring contacts (8) being inserted into a housing opening (9) of a housing wall (10) of the housing to electrically contact the electrical equipment.

2. The bus connector system according to claim 1, characterized in that the bus circuit board (2) is attached to a housing wall (10) of the housing using a snap element (12).

3. The bus connector system according to claim 2, characterized in that the snap element (12) is realized as an integrated component on the housing wall (10).

4. The bus connector system according to claim 1, characterized in that the bus circuit board (2) is attached to a housing wall (10) of the housing using a holding bracket (16) that is realized as a separate component.

5. The bus connector system according to claim 4, characterized in that the holding bracket (16) has hooks (20) that engage into openings (26) of the housing wall (10) and are secured against release by being laterally displaced and locked in place.

6. The bus connector system according to claim 2, characterized in that the bus circuit board (2) has an outer contour that has recesses into which the snap element (12) or the holding bracket (16) engage.

7. The bus connector system according to claim 1, characterized in that the bus circuit board (2) has a male connector strip (4) and a female connector strip (6) by means of which an electrical contact and a pluggable mechanical connection can be produced between the bus circuit boards (2).

8. A bus connector system comprising a bus circuit board (2) for producing an electrical connection between electrical equipment, wherein
the bus circuit board (2) is attached in a removable manner to a housing of the electrical equipment and that by plugging the bus circuit boards (2) together, an elongated arrangement of buses is produced in the shape of a mechanical cross-connection for the housings of the electrical equipment, which are arranged side by side, and
the bus circuit board (2) is attached to a housing wall (10) of the housing using a holding bracket (16) that is realized as a separate component, the holding bracket having hooks (20) that engage into openings (26) of the housing wall (10) and are secured against release by being laterally displaced and locked in place.

* * * * *